(12) United States Patent
Fountain et al.

(10) Patent No.: US 11,837,988 B2
(45) Date of Patent: Dec. 5, 2023

(54) THERMAL RECTIFYING ANTENNA COMPLEX (TRAC)

(71) Applicant: University of South Florida, Tampa, FL (US)

(72) Inventors: Michael Wayne Fountain, Tampa, FL (US); Gabriel Lee Saffold, Wesley Chapel, FL (US)

(73) Assignee: University of South Florida, Tampa, FL (US)

(*) Notice: Subject to any disclaimer, the term of this patent is extended or adjusted under 35 U.S.C. 154(b) by 607 days.

(21) Appl. No.: 15/976,167

(22) Filed: May 10, 2018

(65) Prior Publication Data

US 2018/0262155 A1    Sep. 13, 2018

Related U.S. Application Data

(63) Continuation-in-part of application No. PCT/US2017/015334, filed on Jan. 27, 2017, which
(Continued)

(51) Int. Cl.
 H02S 10/30  (2014.01)
 H01Q 1/24  (2006.01)
(Continued)

(52) U.S. Cl.
 CPC .......... H01Q 1/248 (2013.01); H01L 31/08 (2013.01); H01L 31/09 (2013.01); H02N 11/002 (2013.01);
(Continued)

(58) Field of Classification Search
 CPC ....... H02S 10/30; H01L 31/08; H01L 31/085; H01L 31/09
 See application file for complete search history.

(56) References Cited

U.S. PATENT DOCUMENTS

| 4,331,829 A * | 5/1982 | Palazzetti | ......... H01L 31/02168 |
| | | | 136/253 |
| 6,084,173 A * | 7/2000 | DiMatteo | ................ H02S 10/30 |
| | | | 136/201 |

(Continued)

OTHER PUBLICATIONS

DeMeo, Dante F. et al.; Chapter 17—thermophotovoltaics: An Alternative to and Potential Partner with Rectenna Energy Harvesters; G. Moddel and S. Grover (eds.) Rectenna Solar cells; 2013; pp. 371-390 (Year: 2013).*

(Continued)

*Primary Examiner* — Daniel P Malley, Jr.
(74) *Attorney, Agent, or Firm* — Owen G. Behrens; Smith & Hopen, P.A.

(57) ABSTRACT

A method and device to collect and convert thermal energy from the surrounding environments to produce usable electric power. The device includes a rectenna that is preferably a narrow bandwidth rectenna. In an embodiment, the rectenna comprises a rectenna complex, which is, in sequence, a high gain antenna, optional matching circuits, an optional narrow bandpass filter, and one or more rectifying diodes. An embodiment may include multiple arrays of linked nanoscale rectenna complexes. When linked in arrays using preselected bandwidths in the infrared and near infrared spectral regions, the rectenna complex acts as a thermally responsive collector capable of extracting heat energy from its surrounding environment to produce usable electric power.

9 Claims, 4 Drawing Sheets

Related U.S. Application Data is a continuation of application No. 62/287,618, filed on Jan. 27, 2016.

(51) Int. Cl.
  H01L 31/08 (2006.01)
  H01L 31/09 (2006.01)
  H02S 99/00 (2014.01)
  H02N 11/00 (2006.01)
  H02M 7/06 (2006.01)

(52) U.S. Cl.
  CPC ............. *H02S 10/30* (2014.12); *H02S 99/00* (2013.01); *H02M 7/06* (2013.01); *Y02E 10/46* (2013.01)

(56) References Cited

U.S. PATENT DOCUMENTS

| | | | |
|---|---|---|---|
| 6,668,197 | B1 | 12/2003 | Habib et al. |
| 6,835,949 | B2 | 12/2004 | Weiss et al. |
| 7,486,236 | B2 | 2/2009 | Sarehraz et al. |
| 7,619,570 | B1 | 11/2009 | Sarehraz et al. |
| 8,115,683 | B1 | 2/2012 | Stefanakos et al. |
| 8,338,772 | B2 * | 12/2012 | Kotter ................. H02S 99/00 250/208.2 |
| 8,452,134 | B1 | 5/2013 | Davids et al. |
| 8,803,340 | B2 | 8/2014 | Moddel |
| 2005/0109386 | A1 * | 5/2005 | Marshall ............. G02B 1/005 136/253 |
| 2009/0171404 | A1 | 7/2009 | Irani et al. |
| 2012/0076162 | A1 | 3/2012 | Girlando |
| 2013/0146117 | A1 * | 6/2013 | Brady .................. H02S 10/30 136/201 |
| 2013/0207604 | A1 * | 8/2013 | Zeine .................. H02J 7/0047 320/108 |
| 2013/0213460 | A1 * | 8/2013 | Matsumoto ......... H02S 10/30 136/253 |
| 2014/0373535 | A1 | 12/2014 | Moddel |
| 2015/0372621 | A1 * | 12/2015 | Brady ................ H01L 31/0264 310/306 |

OTHER PUBLICATIONS

Definitions: Rectenna; https://www.definitions.net/definition/rectenna; accessed and printed Mar. 22, 2022 (Year: 2022).*

MW Components: Metal Bellows; https://www.mwcomponents.com/metal-bellows; accessed and printed Mar. 22, 2022 (Year: 2022).*

Jones, "What is the visible light spectrum?", https://www.thoughtco.com/the-visible-light-spectrum-2699036, All Pages, 2023. (Year: 2023).*

M. Sarehraz, "Novel Rectenna for Collection of Infrared and Visible Radiation," PHD Thesis, Univ. South Florida, Tampa, No. March, pp. 1-178, 2005.

A. Sharma, V. Singh, T. L. Bougher, and B. A. Cola, "A carbon nanotube optical rectenna.," Nat. Nanotechnol., vol. 10, No. 12, pp. 1027-1032, 2015.

Z. Zhu, S. Joshi, S. Grover, and G. Moddel, "Graphene geometric diodes for terahertz rectennas," J. Phys. D. Appl. Phys., vol. 46, No. 18, p. 185101, 2013.

P. S. Davids, R. L. Jarecki, A. Starbuck, D. B. Burckel, E. A. Kadlec, T. Ribaudo, E. A. Shaner, and D. W. Peters, "Infrared rectification in a nanoantenna-coupled metal-oxide-semiconductor tunnel diode," Nat. Nanotechnol., vol. 10, 2014.

M. R. Abdel-Rahman and G. D. Boreman, "A millimeter-wave CPW-fed twin slot/infrared dipole antenna coupled Ni—NiO—Ni diode," Antennas Propag., pp. 2851-2854, 2004.

B. N. Tiwari, P. J. Fay, G. H. Bernstein, A. O. Orlov, and W. Porod, "Effect of read out interconnects on the polarization characteristics of nanoantennas for the long-wave infrared regime," IEEE Trans. Nanotechnol., vol. 12, No. 2, pp. 270-275, 2013.

X. Shao, N. Goldsman, N. Dhar, F. Yesilkoy, A. Akturk, S. Potbhare, and M. Peckerar, "Simulation Study of Rectifying Antenna Structure for Infrared Wave Energy Harvesting Applications," SISPAD, pp. 249-252, 2012.

J. G. Small, G. M. Elchinger, A. Javan, A. Sanchez, F. J. Bachner, and D. L. Smythe, "Ac electron tunneling at infrared frequencies: Thin-film M-O-M diode structure with broad-band characteristics," Appl. Phys. Lett., vol. 24, No. 6, pp. 275-279, 1974.

A. M. A. Sabaawi, C. C. Tsimenidis, and B. S. Sharif, "Analysis and modeling of infrared solar rectennas," IEEE J. Sel. Top. Quantum Electron., vol. 19, No. 3, 2013.

K. Joulain and A. Loizeau, "Coherent thermal emission by microstructured waveguides," J. Quant. Spectrosc. Radiat. Transf., vol. 104, No. 2, pp. 208-216, 2007.

J.-J. Greffet and C. Henkel, "Coherent thermal radiation," Contemp. Phys., vol. 48, No. 4, pp. 183-194, 2007.

M. Laroche, R. Carminati, and J. J. Greffet, "Coherent thermal antenna using a photonic crystal slab," Phys. Rev. Lett., vol. 96, No. 12, pp. 2-5, 2006.

J.-J. Greffet, R. Carminati, K. Joulain, J.-P. Mulet, S. Mainguy, and Y. Chen, "Coherent emission of light by thermal sources," Nature, vol. 416, No. March, pp. 61-64, 2002.

C. Henkel, K. Joulain, R. Carminati, and J. J. Greffet, "Spatial coherence of thermal near fields," Opt. Commun., vol. 186, No. 1-3, pp. 57-67, 2000.

M. Laroche, C. Arnold, F. Marquier, R. Carminati, J. J. Greffet, S. Collin, N. Bardou, and J. L. Pelouard, "Highly directional radiation generated by a tungsten thermal source.," Opt. Lett., vol. 30, No. 19, pp. 2623-2625, 2005.

F. Marquier, K. Joulain, J. P. Mulet, R. Carminati, and J. J. Greffet, "Engineering infrared emission properties of silicon in the near field and the far field," Opt. Commun., vol. 237, No. 4-6, pp. 379-388, 2004.

I. S. Nefedov and L. A. Melnikov, "Super-Planckian far-zone thermal emission from asymmetric hyperbolic metamaterials," Appl. Phys. Lett., 105, 2014.

M. N. Gadalla, M. Abdel-Rahman & Atif Shamim, "Design, Optimization and Fabrication of a 28.3 THz Nano-Rectenna for Infrared Detection and Rectification," Scientific Reports, 4 : 4270, pp. 1-9, 2014.

MD Kamal Hosain, Abbas Z. Kouzani, (Member, IEEE), MST Fateha Samad, and Susannah J. Tye, "A Miniature Energy Harvesting Rectenna for Operating a Head-Mountable Deep Brain Stimulation Device," IEEE Access, vol. 3, pp. 223-234, 2015.

S. Krishnan, Y. Goswami, and E. Stefanakos, "Nanoscale Rectenna for Thermal Energy Conversion to Electricity," Technology and Innovation, vol. 14, pp. 103-113, 2012.

Y. Pan, C. V. Powell, A. M. Song, and C. Balocco, "Micro rectennas: Brownian ratchets for thermal-energy harvesting," Applied Physics Letters 105, 253901, 2014.

International Search Report for Application No. PCT/US17/15334 with International Filing date of Jan. 27, 2017, and dated May 23, 2017.

\* cited by examiner

THERMAL RECTIFYING ANTENNA COMPLEX (TRAC)

CROSS-REFERENCE TO RELATED APPLICATIONS

This nonprovisional application is a continuation of and claims priority to nonprovisional application No. PCT/US2017/015334, entitled "THERMAL RECTIFYING ANTENNA COMPLEX (TRAC)," filed Jan. 27, 2017 by the same inventors, which is a continuation of and claims priority to provisional application No. 62/287,618, entitled "THERMAL RECTIFYING ANTENNA COMPLEX (TRAC)," filed Jan. 27, 2016 by the same inventors.

BACKGROUND OF THE INVENTION

1. Field of the Invention

This invention relates, generally, to electrical generators. More specifically, it relates to the collection and conversion of thermal energy into electrical energy.

2. Brief Description of the Prior Art

The ever-increasing demand for alternative energy has been a major catalyst in the research and development of long-lasting alternative and renewable energy sources. One energy source of particular importance to this patent application is thermal radiation, such as ambient waste heat. Some studies suggest that "[w]aste heat vacillates between, approximately, 400 K and 2000 K (2-11 mm) and is produced by different sources such as metal heating and melting, steam generation, fluid heating, heat treating, and agglomeration." [19].

Currently, there exist devices for converting solar energy into electrical power. For example, the paper *Design, Optimization and Fabrication of a 28.3 THz Nano-Rectenna for Infrared Detection and Rectification* describes a rectenna at 28.3 THz for rectification and detection of infrared thermal radiation at 28.3 THz in the context of solar power conversion. Id. The advantage of this approach is that solar conversion happens at distances from the source (the Sun) much larger than the wavelength corresponding to 28.3 THz. Therefore, the 28.3 THz wavelength falls in the far field region, in which the electromagnetic behavior is well defined and can be relatively easily modeled. The disclosed approach, however, does not provide a means of capturing thermal energy in near field applications, and is also inefficient. Furthermore, the devices that would capture thermal radiation from the sun on earth subtend a solid angle that is smaller than the coherence length of the solar radiation, allowing the radiation to appear coherent to the device.

Near field applications are more difficult because near field radiation is scattered. The power is dominated by reactive components. In contrast, far field radiation is more uniform, barring scattering or other disruptive effects in the environment, as in the case with light traveling through earth's atmosphere. In addition, far field radiation is dominated by real power, rather than reactive power.

Infrared and visible rectifying antennas—nano-antennas integrated with tunneling diodes—have been proposed and demonstrated as devices capable of identifying thermal energy. [1]-[10]. For infrared energy harvesting, it is necessary to address the coherence and bandwidth of the nature of blackbody radiation consistent with Planck's Law.

Broadband antennas are achievable, although with limited efficiency as compared to narrowband antennas. In addition, it has proven difficult to also achieve broadband rectifying diodes in the terahertz regime. Furthermore, incoherent radiation creates deconstructive interference on the surface of the antenna, driving down the antenna and rectifier efficiency. For greatest efficiency in both the capture of the radiation with an antenna and the rectification with a diode, coherent, narrowband radiation is desirable. Infrared radiation is generally broadband and incoherent, which has a significant impact on the efficiency for capturing infrared radiation with a rectenna.

Broadband means there are a large number of wavelengths experienced at the antenna, each wavelength with a portion of the overall energy, oscillating between maximum and minimum voltages and currents at different times, which decrease overall efficiency. Currently, antennas have been designed to capture broadband electromagnetic waves, such as bowtie antennas, but the broad number of wavelengths lowers the overall efficiency.

Efforts have been made to understand the nature of infrared radiation to find modes of coherence and to create materials that exhibit both narrowband and coherent radiation. [11]-[14]. It has been discovered that flat thermal radiators exhibit spatial coherence in the near field: less than one wavelength. [12], [15]. Others have demonstrated that thermal sources can act as antennas—radiating narrowband lobes off-axis at different angles for different bands, as in FIGS. 1-2. [13], [14], [16], [17].

Similar structures to FIG. 1 have been built with Tungsten. [16]. Others have proposed and demonstrated meta-material photonic crystal structures and asymmetric hyperbolic metamaterials, such as graphene multilayer which demonstrate coherent, narrowband infrared radiation, with some even exhibiting higher power than what Planck's Law would predict for a given wavelength (emissivity greater than 1). [13], [18].

Unlike prior work, the present invention solves the problems of collecting broadband, incoherent thermal radiation with rectennas, not by designing more broadband, consequently less efficient, antennas and diodes, but instead by using narrowband rectennas in conjunction with coherent, narrowband thermal radiators (also called "collector/emitters") as an intermediate emitter. These intermediate radiators make it possible to harvest energy from thermal radiating objects with greater efficiency than is possible using only antennas and diodes. However, in view of the art considered as a whole at the time the present invention was made, it was not obvious to those of ordinary skill in the field of this invention how the shortcomings of the prior art could be overcome.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

While certain aspects of conventional technologies have been discussed to facilitate disclosure of the invention, Applicants in no way disclaim these technical aspects, and it is contemplated that the claimed invention may encompass one or more of the conventional technical aspects discussed herein.

The present invention may address one or more of the problems and deficiencies of the prior art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

BRIEF SUMMARY OF THE INVENTION

The long-standing but heretofore unfulfilled need for a method and system to efficiently and effectively convert thermal energy into electrical power that can operate in both the near and far field regions is now met by a new, useful, and nonobvious invention.

The novel structure includes a rectenna having, in sequence, an antenna and one or more rectifying diodes, and a radiator secured between the rectenna and a source of thermal energy. The radiator has a predetermined design and material composition, such that the radiator emits one or more lobes of coherent narrowband electromagnetic waves when heat transfers from the source of thermal energy to the radiator. The antenna is configured to capture electromagnetic energy from one of the lobes of coherent narrowband electromagnetic waves emitted from the radiator. The antenna is able to capture the narrowband electromagnetic waves emitted from the radiator and converts the electromagnetic waves into alternating current. The diodes then convert the alternating current into direct current, which may be used or stored for later use.

An embodiment may include a plurality of linked rectennas each configured to capture one of the lobes of coherent narrowband electromagnetic waves emitted from the radiator. Thus, several rectennas can be used to capture several lobes of radiation emitted from the radiator to increase the efficiency of the system.

An embodiment includes a vacuum chamber located between the radiator and the rectenna. The length of the vacuum is dependent on the wavelength of the electromagnetic waves emitted from the radiator: ranging from one quarter wavelength to twice the wavelength. The vacuum provides a channel through which the emitted EM waves can travel in a uniform manner free of scattering and other disruptive effects.

In an embodiment, the antenna is a high gain antenna, and the rectenna is preferably operational between 4 and 1400 degrees Celsius. In an embodiment, the radiator collects energy from heat through conductive, convective, and/or radiative heat transfer from the heat source and emits electromagnetic waves in the infrared spectrum.

The novel method of converting thermal energy into electrical energy includes identifying a target wavelength for a rectenna; selecting a radiator having a design and material composition capable of emitting narrowband electromagnetic waves when the radiator has been heated; determining a desired distance between the radiator and the rectenna based on the target wavelength; constructing a rectenna-radiator assembly with the rectenna and radiator separated by the desired distance and the radiator and rectenna oriented such that the radiator emits electromagnetic waves towards the rectenna; placing the rectenna-radiator assembly at a location, such that heat is transferred to the radiator from a heat source; capturing of electromagnetic waves emitted from the radiator, by the rectenna; and converting the electromagnetic waves into direct current, by the rectenna.

An embodiment may include the step of identifying the heat source and selecting/designing the radiator to emit electromagnetic waves having a bandwidth that will maximize the electromagnetic waves energy.

An embodiment further includes the step of constructing a vacuum chamber between the rectenna and the radiator, wherein the vacuum chamber occupies the desired distance between the radiator and the rectenna.

These and other important objects, advantages, and features of the invention will become clear as this disclosure proceeds.

The invention accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

For a fuller understanding of the invention, reference should be made to the following detailed description, taken in connection with the accompanying drawings, in which.

DETAILED DESCRIPTION OF THE INVENTION

In the following detailed description of the preferred embodiments, reference is made to the accompanying drawings, which form a part thereof, and within which are shown by way of illustration specific embodiments by which the invention may be practiced. It is to be understood that other embodiments may be utilized and structural changes may be made without departing from the scope of the invention.

The present invention provides a novel method and device for capturing and converting thermal energy to electrical energy. The device converts thermal radiation into an alternating current (AC) and then converts the AC into a direct current (DC). All matter emits electromagnetic (EM) radiation at temperatures above absolute zero. The frequency and radiance of the EM radiation is described by Planck's law. Planck's law describes the distribution of radiance across a range of frequencies for a black body in thermal equilibrium at a particular temperature. Wien's displacement law provides a way to determine the frequency at which the spectral radiance is the highest: a direct relationship for frequency of EM radiation at a particular temperature. The Stefan-Boltzmann law describes the power radiated at a particular temperature.

Given these relationships, heat can be understood in terms of EM radiation. The present invention converts the thermal radiation component of thermal energy into electrical energy, which is fundamentally the same as converting free space EM radiation into AC and then into DC. The conversion from EM radiation to DC is accomplished using antennas and diodes. Antennas are defined by their ability to convert free space EM radiation into AC along a conductor. Diodes are defined by their nonlinear behavior and unidirectional nature of allowed current flow, which is commonly used to rectify AC into DC. The antenna and diode combination creates a rectifying antenna, or "rectenna" for short.

Figure 3A:
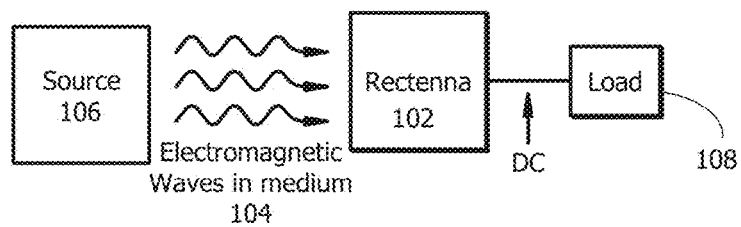
FIG. 3A is a block diagram of a basic rectenna assembly receiving coherent electromagnetic waves.
Figure 3B:
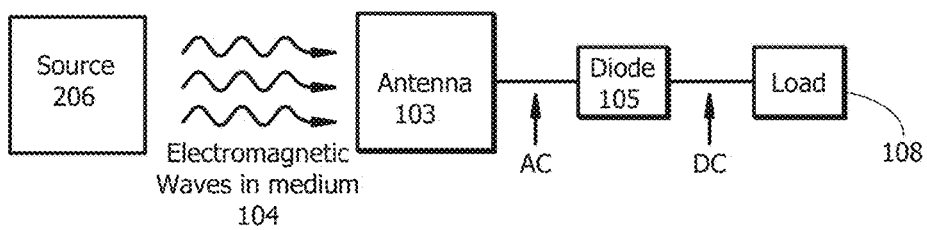
FIG. 3B is a block diagram illustrating the breakdown of the rectenna into an antenna and a diode.

As depicted in FIG. 3A, a basic rectenna 102 can convert EM waves 104 from thermal energy source 106 into a DC load 108. FIG. 3B depicts the separation of rectenna 102 into antenna 103 and diode 105 to illustrate the conversion of the EM waves 104 into AC and then into DC.

As previously explained, using broadband antennas to harvest thermal energy suffers from the difficulties in producing an efficient broadband rectifying diode. Therefore, an embodiment of the present invention, as depicted in FIG. 4, includes narrowband antenna 203 to bypass this problem.

Moreover, it is known that near field thermal radiation experiences deconstructive interference from incoherent radiation, which significantly effects the efficacy of rectennas. Therefore, as depicted in FIG. 4, an embodiment of the present invention includes an intermediate thermal radiator 210 (also referred to as a "collector/emitter") disposed at a predetermined distance from a thermal energy source.

Figure 4:
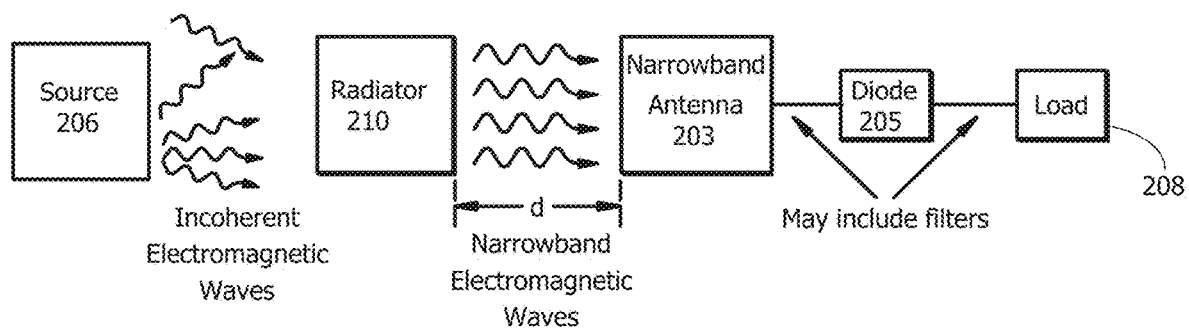
FIG. 4 is a block diagram of an embodiment of the present invention.
Figure 5:
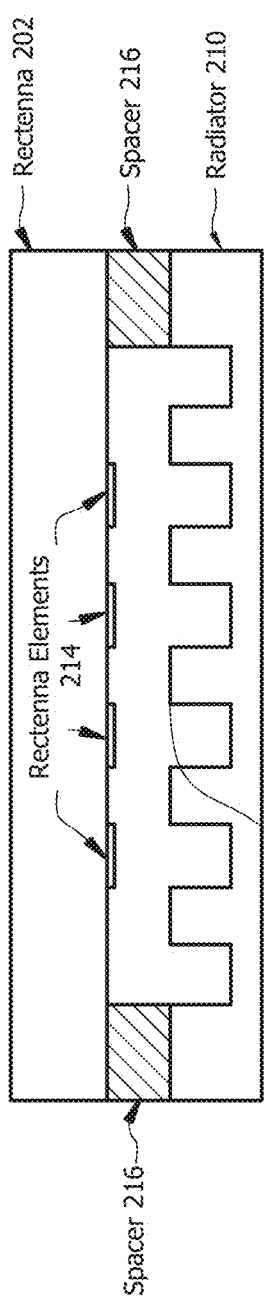
FIG. 5 is an elevation view of an embodiment of the present invention.
Figure 6:
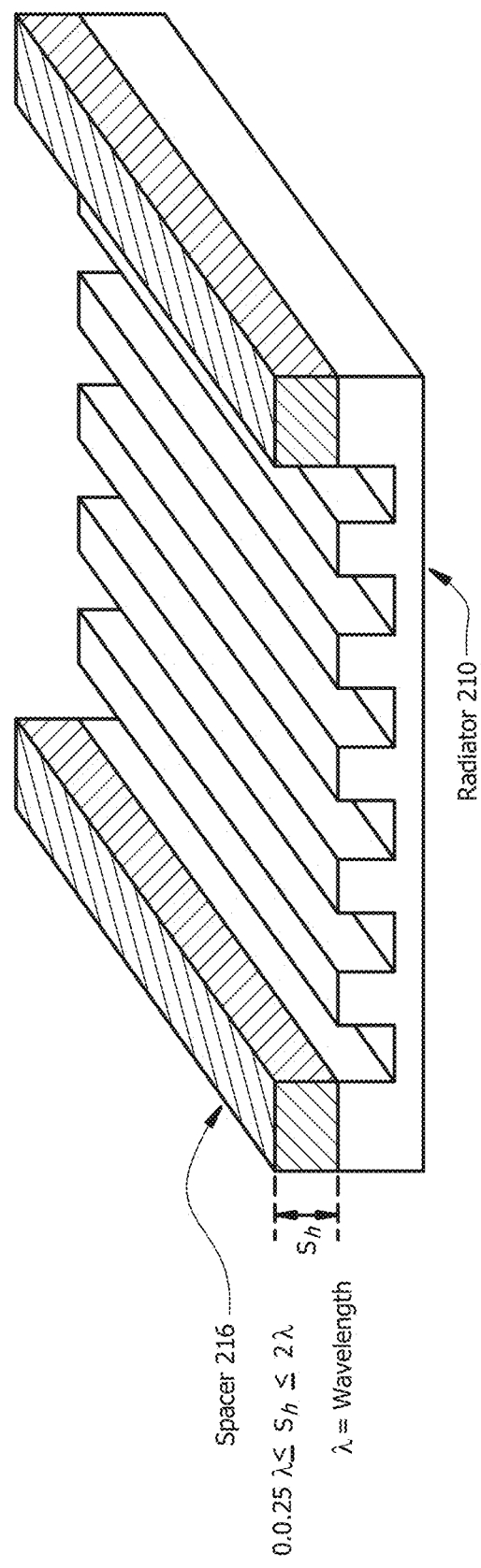
FIG. 6 is a perspective view of an embodiment of the present invention.

Referring now to FIGS. 4-6, an embodiment of the present invention includes radiator 210 intermediately disposed between rectenna 202 and thermal energy source 206. Radiator 210 is placed in contact with, near, or in a heat source 206. Heat source 206 transfers heat to the intermediate radiator 210 by conduction, convection, or radiation until radiator 210 is in equilibrium with source 206. As intermediate radiator 210 collects heat energy, it will radiate from surface 212, which is facing rectenna 202.

Surface 212 has been modified to radiate coherent, narrowband radiation, and rectenna 202 is oriented to face intermediate radiator 210. Effectively, radiator 210 absorbs heat energy through conduction, convection, and broadband, incoherent thermal radiation and converts the thermal energy into coherent, narrowband radiation, which can be efficiently and effectively harvested by rectenna 202. Radiator 212 becomes the effective source of the EM waves as viewed from rectenna 202.

Figure 1:
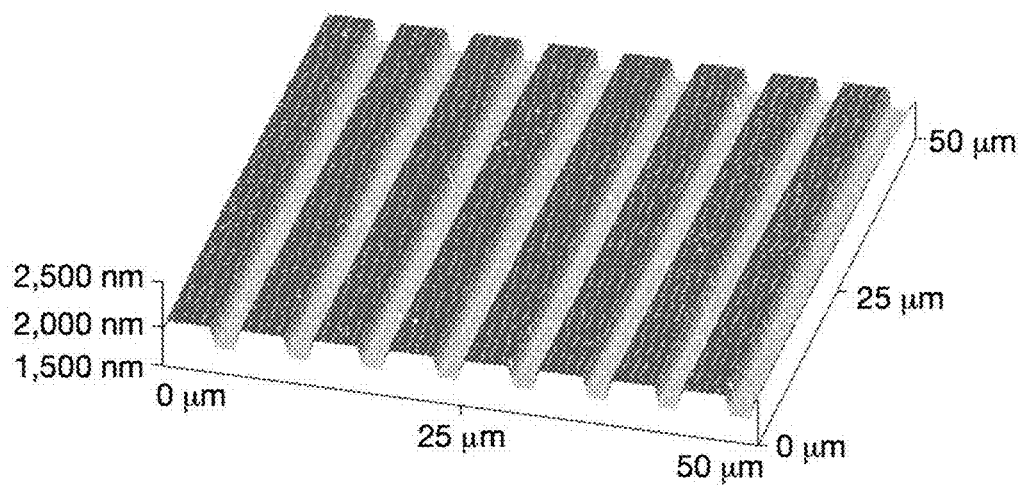
FIG. 1 is a depicts a periodic grated polar material that emits coherent narrowband electromagnetic waves when heated.
Figure 2:
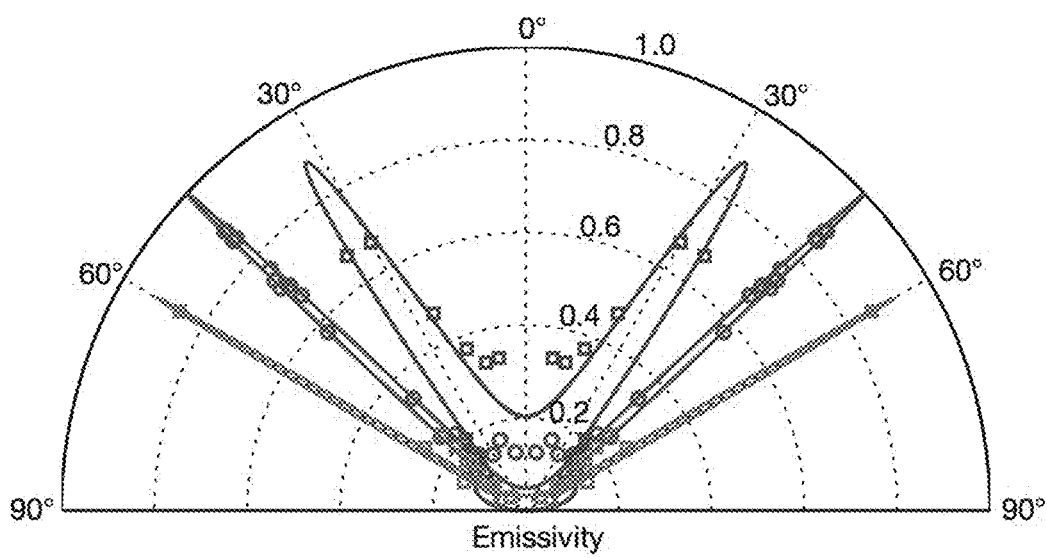
FIG. 2 is an illustration of angular emissivity of the device in FIG. 1.

As depicted in FIG. 2, radiator 210 can be specifically designed to emit specific narrowband lobes at different angles for different bands, while effectively filtering out incoherent and unwanted frequency bands radiating from the heat source. Radiator 210 includes a shape and material composition that are both dependent on the desired emission of specific narrowband lobes. The bandwidth of the emitted waves and the angle of the emission, with respect to the normal of radiator surface 212, is dependent on the shape and material composition of radiator 210.

Radiator 212 can have any shape that emits coherent, narrowband lobes in the infrared or near infrared spectrum, including, but not limited to flat surfaces and vertically aligned carbon nanotubes. The radiator also preferably comprises of material that has high emissivity, including but not limited to tungsten; metamaterials, such as the asymmetric hyperbolic metamaterial multilayer graphene; and lamellar grating in polar materials such as silicon carbide or tungsten. Preferably, radiator 212 is made of any material composition that emits coherent, narrowband lobes in the infrared or near infrared spectrum, including, but not limited to lamellar grated tungsten or silicon carbide.

Once the radiator design and material composition is chosen, the radiator will emit the same frequency no matter the heat source. The radiator will produce lobes of radiation not typically found in nature and each rectenna element 214 can be tuned and located to receive a specific lobe of radiation.

The two components, intermediate radiator 210 and rectenna 202, are preferably packaged together as a single device, referred to hereinafter as a rectenna-radiator assembly. The assembly includes spacers 216 to set the distance between radiator 210 and rectenna 202 and are made of the boding material between the radiator 210 substrate and the rectenna 202 substrate including, but not limited to adhesive bonding with thermally stable SU-8. An alternate method for controlling the distance between the radiator 210 and rectenna 202 is etching a cavity of desired depth in either the radiator 210 or rectenna 202 substrate and forming the rectenna elements and radiating features in the bottom of the cavity using standard lithographic techniques, including but not limited to wet etching with Buffered Oxide Etch or KOH etch.

The distance between the two components depends on the design/type of radiator in use: some radiators will require less than one wavelength for coherence, others achieve coherence at distances greater than one wavelength. The distance between the two will generally fall within a range between 0.25 and 2 times the wavelength of the target frequency.

In an embodiment, a vacuum extends the distance between radiator 210 and rectenna 202. The vacuum provides a channel through which the emitted EM waves can travel in a uniform manner free of scattering and other disruptive effects.

Generally, rectenna elements 214 are offset from the normal of intermediate radiator surface 212 because lobes of radiation emit at angles with respect to the normal of radiator surface 212, as illustrated in FIG. 2. Different wave lengths of EM radiation are emitted in different directions for a given radiator. Therefore, an embodiment, as depicted in FIG. 5, includes several rectenna elements 214 secured at different locations on the inward facing surface of rectenna 202. Each rectenna element 214 can be tuned to capture a specified wavelength of EM radiation and secured at the location on rectenna 202 corresponding to the angle at which the lobe of radiation is emitted from radiator 210. As a result, rectenna 202 can be configured to capture energy from the various lobes of radiation emitted from radiator 210. The combined accumulation of DC from each rectenna element 214 increases the efficiency of converting thermal energy to electrical energy, which can be directly fed to an electrical device or stored in an electrical storage device, such as a battery.

In an embodiment, the rectenna is in contact with or immersed in a thermal energy source capturing thermal EM radiation through inductive coupling, similar to the mechanism used in near field communication antennas. In near field communication, the EM energy from a transmitter is used to energize a receiver enough to power a response that is transmitted back to the original transmitter. Alternatively, the system can convert the received AC power, real and reactive, to real power delivered to a DC load.

In an embodiment, the present invention includes a rectenna that is preferably a narrow bandwidth nanoscale rectenna. Alternatively, an embodiment may use broadband antennas. Broadband antennas can act like narrowband antennas when the energy presented to it is narrowband. The narrowing of the bands from the radiator eliminates the negative broadband effects.

In an embodiment, the rectenna comprises a rectenna complex, which is, in sequence, a high gain antenna, optional matching circuits, an optional bandpass filter, and one or more rectifying diodes. An embodiment may include multiple arrays of linked nanoscale rectenna complexes. When linked in arrays using preselected bandwidths in the infrared and near infrared spectral regions, the rectenna complex acts as a thermally responsive collector capable of extracting heat energy from its surrounding environment to produce usable electric power.

In an embodiment, the structure composed of an intermediate radiator above an array of thermal rectifying antennas can be expanded into stacks of the same. In this embodiment, a single, stackable unit consists of the ground plane, substrate, oxide layer, rectennas, spacing material, and intermediate radiator. The ground plane of the next unit is placed above and in contact with the intermediate radiator of the first unit. In this way, the thermal rectifying antenna complex may be stacked, creating a more dense configuration of rectennas allowing for harvesting of more of the available energy and its conversion to DC current.

The structure may be a simple stack in one direction or may be of more complex geometries, including stacks in all directions. Moreover, the geometries may be regular or irregular structures. The stack may be composed of all solid layers or also combinations of solid layers and channels through which heated fluids (liquids, gases or combinations of liquids and gases) may flow and transfer energy to the rectennas as they move through the channels. The fluids are promptly replaced by the next volume of fluid which enters the channel and transfers energy.

Arrays may be formed that are either a large collection of rectennas in close proximity or they may be specifically designed as an antenna array to take advantage of increasingly effective areas and gains. These arrays may be homogenous arrays of exactly the same rectenna elements or they may consist of rectennas of different materials, antenna shape and form factors designed for various infrared frequencies, allowing the capture of a larger portion of the infrared spectrum than is possible with only one rectenna design and the optimization of the electrical energy output based on specific temperature ranges.

The concept of the stacks and three dimensional structures described above may also be composed of a new composition of matter. Rectennas composed of a gold reflector layer, high resistivity intrinsic silicon, silicon dioxide, aluminum, aluminum dioxide, and platinum have proven to outperform other compositions. This composition of matter is in the overlapped bow-tie antenna configuration with a horizontally-integrated metal-insulator-metal diode between the lower aluminum bowtie arm and the upper platinum bowtie arm. This composition may also be used in non-stacked versions of the device.

Figure 7:
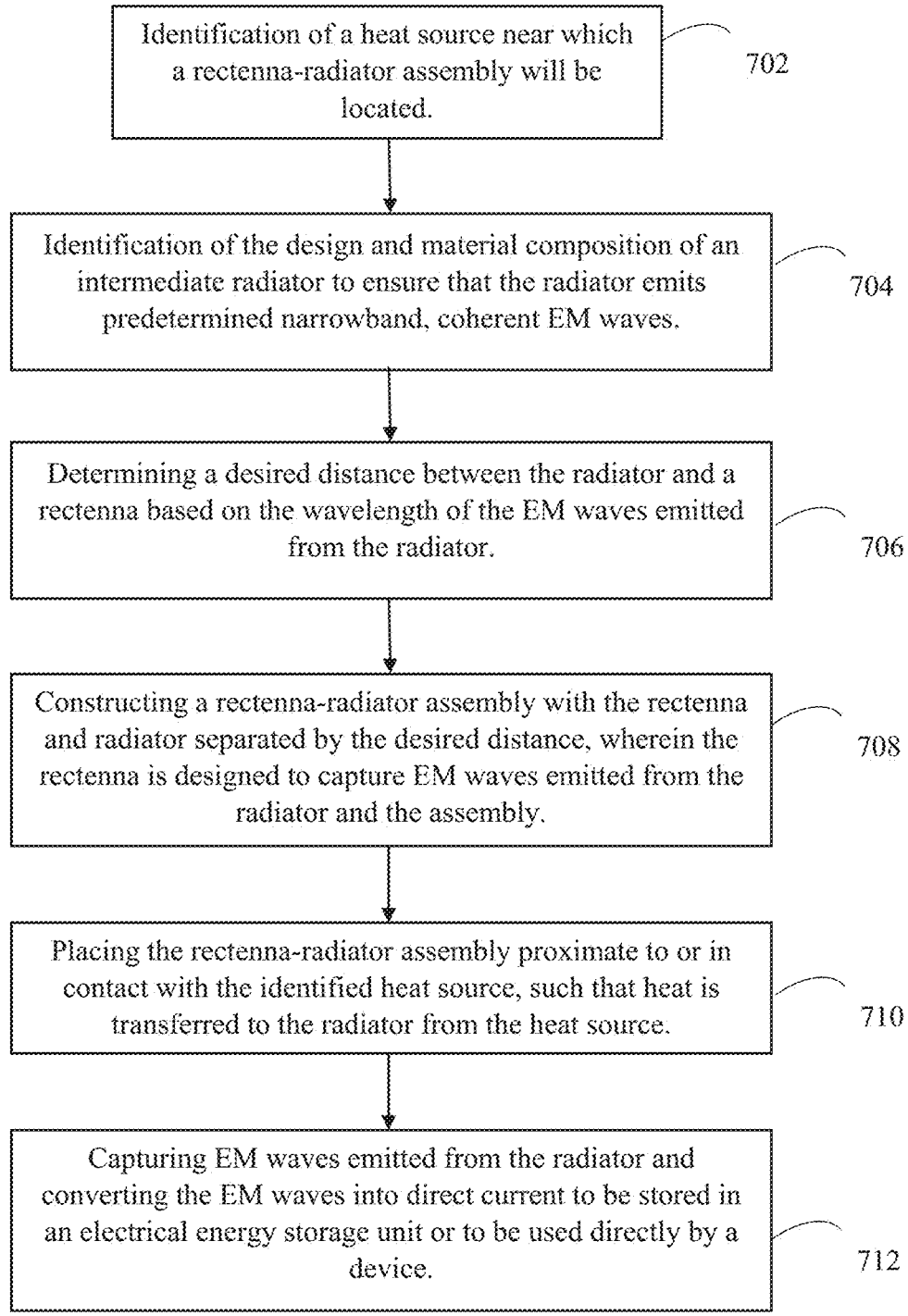
FIG. 7 is a flowchart of an embodiment of the present invention.

The novel method of converting thermal energy into electrical energy is detailed in FIG. 7. In an embodiment, the method includes first identifying the heat source near which the rectenna-radiator assembly will be located, at step 702. While the heat source itself will not alter the radiators emission properties (bandwidth of EM waves emitted and angle of emission) the radiator can be specifically designed/chosen/tuned to emit the frequencies with the most power available as predicted by Plank's Law for blackbody radiation at the temperature of the source. The thermal energy of the radiator will, however, affect the energy produced for a predetermined EM wave. Therefore, it is preferable to know the expected magnitude of the thermal energy projected from the heat source prior to designing/choosing/tuning a radiator, but it is not required.

At step 704 the design and material composition of the radiator is identified to ensure that the radiator emits predetermined narrowband, coherent EM waves that correspond to the intended design of the rectenna. The rectenna is designed to receive EM waves of a predetermined wavelength, and thus, it is important to have a radiator that emits EM waves having the predetermined wavelength. In an embodiment, it may be beneficial to design the rectenna around the design of the radiator, instead of designing the radiator around the rectenna. Either way, the rectenna must be adapted to capture EM waves emitted from the radiator.

Once the radiator and rectenna design are determined, the distance between the two is determined at step 706. As previously explained, the distance is a factor of the target wavelength and has a magnitude generally falling between 0.25 and 2 times the shortest target wavelength.

At step 708, the rectenna-radiator assembly is constructed with the rectenna and radiator separated by the distance determined in step 706. The assembly is then placed proximate to or in contact with the heat source, at step 708, allowing heat to transfer to the radiator. At step 712, the EM waves emitted by the heated radiator are captured by the rectenna and converted to DC.

The method of the present invention provides a novel means for capturing thermal energy ranging generally from 4 to 1400 degrees Celsius. The system is particularly useful for capturing thermal energy from a wide range of waste heat sources to produce useable electrical current for immediate use or storage for use at a later time. These include but are not limited to:

| | | |
|---|---|---|
| 1. | Furnace or Heating System Exhaust Gases | 316-1,100 C. |
| 2. | Gas Turbine Exhaust Gasses | 480-600 C. |
| 3. | Reciprocating Engines: | |
| | Jacket Cooling Water | 90-100 C. |
| | Exhaust Gases (for gas fuels) | 480-600 C. |
| 4. | Hot Surfaces | 65-316 C. |
| 5. | Compressor After or Inter Cooler Water | 38-82 C. |
| 6. | Hot Products | 100-1,370 C. |
| 7. | Steam Vents or Leaks | 120-316 C. |
| 8. | Condensate | 65-260 C. |
| 9. | Emission Control Devices (Thermal Oxidizers) | 65-816 C. |

The present invention may be used in or on living creatures, capturing the body's heat and converting it into electrical current to power both internal and surface adherent devices, including but not limited to, pace makers and other cardiac assist devices, pumps for administration of biologically active compounds, and other low power devices such as biological monitoring instrumentation including drug level monitoring and diabetic patient monitoring. In all of these examples, the present invention may be used to either replace currently existing replaceable battery power packs or to increase the length of utility of the existing power pack through the use of the present invention as a charging device capable of charging the battery source while the battery source is in use.

The present invention may be configured to capture the thermal energy of fluids in reservoirs to produce electrical current to power a wide group of devices. The present invention may be placed onto the surface of the reservoir containing the fluid or placed directly into or onto the surface of the fluid. The fluid may include but is not limited to, water, other aqueous solutions containing dissolved molecules, organic oils, inorganic oils, and other aqueous fluids including biological fluids. The fluid reservoirs may include but are not limited to living organisms, in ground or above ground pools, cisterns, water storage tanks, fluid storage and holding tanks, fluid cooling and hydraulic systems in automobiles, trucks, heavy equipment and trains, cooling systems in existing power plants, heating tanks for hot water and naturally occurring collections of water such as retention ponds, lakes and oceans, or other reservoirs containing confined molecules in a fluid phase.

The present invention may be configured to capture the thermal energy of solid surfaces to produce electrical current to power a wide group of devices. The solid surface can include both absorptive and reflective surfaces into which or onto which the device is either embedded into, affixed onto, or beneath the surface of the solid material. Possible surfaces may include but are not limited to roofs, interior walls of homes, foundation slabs of buildings and homes, road surfaces, and solar collection arrays.

The present invention may be configured to capture the thermal energy of gaseous environments to produce electrical current to power a wide group of devices. The gaseous environment may include but is not limited to the earth's atmosphere and other defined collections of one or more compounds in a gaseous state.

The present invention may be configured as a transmitter and/or sensor to capture the ambient thermal energy to produce electrical current to power devices. This embodiment may be configured but is not limited to light weight, foldable films capable of either providing direct power to devices and/or recharging battery packs. This invention could be used in daily use or configured to be used in emergency situations to convey location and/or body temperature of individuals through the use of a radio, or other, transmitter.

The present invention may be used as a device to identify the physiologic condition of an individual using body surface temperature. The device would be applied onto or in close proximity to the surface of an individual's skin. The device would be activated when the body temperature either exceeds or diminishes below acceptable physiologic parameters. In particular, if the temperature approaches or exceeds the temperature under which the individual may be in risk of thermal shock, either due to environmental factors or increased internal body temperature due to infection, the device, coupled with a transmitter would signal the aberrant temperature of the individual. This would be useful in firefighting activities, hypothermic prone environments, and in situations where individuals exhibit a body temperature below the threshold of survival in normal environmental conditions.

The present invention may be coupled with a compressed fluid in a closed vessel operating as a Carnot Heat Engine. In this application, compressed fluids, such as fluid in hydraulic systems, will produce increased thermal energy, which can be captured by the device to produce useable energy. In addition, this application could be used to couple the thermal energy discharge of vehicles to the device to produce useable electrical power and reduce the environmental thermal energy footprint of the vehicle, in particular breaking systems, and transmissions using closed fluid environments.

In an embodiment, the system can be coupled with an alarm or notification device designed to keep track of the temperature of a heat source. For example, the system can be used as a device to identify the physiologic condition of an individual using body surface temperature. The device would be activated when the body temperature either exceeds or diminishes below acceptable physiologic parameters. In particular, If the temperature approaches or exceeds the temperature under which the individual may be in risk of thermal shock either due to environmental factors or increased internal body temperature, due to infection, the device, coupled with a transmitter would signal the aberrant temperature of the individual. This would be useful in firefighting activities, hypothermic prone environments and in situations where individuals, due to injury or death, would exhibit body temperature below the threshold of survival under normal environmental conditions.

Because the present invention converts heat energy to electrical energy, it could prove to be an effective heat sink, thereby providing electrical power and cooling to devices to which it is affixed or in close proximity.

The present invention is fundamentally an energy conversion device capable of producing power. As a power production device, it is not affected by electromagnetic pulses (EMP), including nuclear blast induced high altitude EMP (HEMP or NEMP). The wavelengths associated with HEMP are too long to affect the invention's power production capability. As a result, it performs during and after a HEMP event.

Glossary of Claim Terms

Bandwidth: is the measure of the width of frequencies.

Heat Source: any object or fluid having a temperature greater than 0 degrees Kelvin.

High Gain Antenna: an antenna with a gain greater than 3 decibels relative to an isotropic radiator (3 dBi).

Infrared Spectrum: a wavelength band between 700 nm and 1 mm (430 THz to 300 GHz in frequency).

Lobe: is a concentration of EM waves, having the same bandwidth, radiating in a given direction.

Narrowband: a band of frequencies that extends starting from the center frequency minus 25% of the center frequency to the center frequency plus 25% of the center frequency.

Near Infrared Spectrum: a wavelength band from 750 nm to 1.4 micrometers

Radiator: a device configured to emit one or more lobes of narrowband electromagnetic waves.

Rectenna: is a rectifying antenna used to convert electromagnetic energy into direct current.

Rectifying Diodes: is a device that creates a unidirectional electrical current flow.

REFERENCES

[1] M. N. Gadalla, M. Abdel-Rahman, and A. Shamim, "Design, Optimization and Fabrication of a 28.3 THz Nano-Rectenna for Infrared Detection and Rectification," *Sci. Rep.*, vol. 4, pp. 1-9, 2014.

[2] M. Sarehraz, "Novel Rectenna for Collection of Infrared and Visible Radiation," *PhD Thesis*, Univ. South Florida, Tampa, no. March, pp. 1-178, 2005.

[3] A. Sharma, V. Singh, T. L. Bougher, and B. A. Cola, "A carbon nanotube optical rectenna.," *Nat. Nanotechnol.*, vol. 10, no. 12, pp. 1027-1032, 2015.

[4] Z. Zhu, S. Joshi, S. Grover, and G. Moddel, "Graphene geometric diodes for terahertz rectennas,"*J. Phys. D. Appl. Phys.*, vol. 46, no. 18, p. 185101, 2013.

[5] P. S. Davids, R. L. Jarecki, A. Starbuck, D. B. Burckel, E. A. Kadlec, T. Ribaudo, E. A. Shaner, and D. W. Peters, "Infrared rectification in a nanoantenna-coupled metal-oxide-semiconductor tunnel diode," *Nat. Nanotechnol.*, vol. 10, 2014.

[6] M. R. Abdel-Rahman and G. D. Boreman, "A millimeter-wave CPW-fed twin slot/infrared dipole antenna coupled Ni—NiO—Ni diode,"*Antennas Propag.*, pp. 2851-2854, 2004.

[7] B. N. Tiwari, P. J. Fay, G. H. Bernstein, A. O. Orlov, and W. Porod, "Effect of read-out interconnects on the polarization characteristics of nanoantennas for the long-wave infrared regime," *IEEE Trans. Nanotechnol.*, vol. 12, no. 2, pp. 270-275, 2013.

[8] X. Shao, N. Goldsman, N. Dhar, F. Yesilkoy, A. Akturk, S. Potbhare, and M. Peckerar, "Simulation Study of Rectifying Antenna Structure for Infrared Wave Energy Harvesting Applications," *SISPAD*, pp. 249-252, 2012.

[9] J. G. Small, G. M. Elchinger, A. Javan, A. Sanchez, F. J. Bachner, and D. L. Smythe, "Ac electron tunneling at infrared frequencies: Thin-film M-O-M diode structure with broad-band characteristics," *Appl. Phys. Lett.*, vol. 24, no. 6, pp. 275-279, 1974.

[10] A. M. A. Sabaawi, C. C. Tsimenidis, and B. S. Sharif, "Analysis and modeling of infrared solar rectennas,"*IEEE J. Sel. Top. Quantum Electron.*, vol. 19, no. 3, 2013.

[11] K. Joulain and A. Loizeau, "Coherent thermal emission by microstructured waveguides,"*J. Quant. Spectrosc. Radiat. Transf.*, vol. 104, no. 2, pp. 208-216, 2007.

[12] J.-J. Greffet and C. Henkel, "Coherent thermal radiation," *Contemp. Phys.*, vol. 48, no. 4, pp. 183-194, 2007.

[13] M. Laroche, R. Carminati, and J. J. Greffet, "Coherent thermal antenna using a photonic crystal slab," *Phys. Rev. Lett.*, vol. 96, no. 12, pp. 2-5, 2006.

[14] J.-J. Greffet, R. Carminati, K. Joulain, J.-P. Mulet, S. Mainguy, and Y. Chen, "Coherent emission of light by thermal sources," *Nature*, vol. 416, no. March, pp. 61-64, 2002.

[15] C. Henkel, K. Joulain, R. Carminati, and J. J. Greffet, "Spatial coherence of thermal near fields," *Opt. Commun.*, vol. 186, no. 1-3, pp. 57-67, 2000.

[16] M. Laroche, C. Arnold, F. Marquier, R. Carminati, J. J. Greffet, S. Collin, N. Bardou, and J. L. Pelouard, "Highly directional radiation generated by a tungsten thermal source.," *Opt. Lett.*, vol. 30, no. 19, pp. 2623-2625, 2005.

[17] F. Marquier, K. Joulain, J. P. Mulet, R. Carminati, and J. J. Greffet, "Engineering infrared emission properties of silicon in the near field and the far field," *Opt. Commun.*, vol. 237, no. 4-6, pp. 379-388, 2004.

[18] I. S. Nefedov and L. A. Melnikov, "Super-Planckian far-zone thermal emission from asymmetric hyperbolic metamaterials,"*Appl. Phys. Lett.,* 2014.

[19] Gadalla, M. N., Abdel-Rahman, M. & Shamim, A. Design, Optimization and Fabrication of a 28.3 THz Nano-Rectenna for Infrared Detection and Rectification. Sci. Rep. 4, 4270; DOI:10,1038/srep04270 (2014).

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

The advantages set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

What is claimed is:

1. A method of converting thermal energy into electrical energy, comprising:
    identifying a predetermined wavelength for a rectenna, the predetermined wavelength selected from the infrared spectrum of wavelengths and having an associated narrowband frequency, the rectenna including an antenna and a diode;
    selecting a radiator configured to capture an incoherent radiation comprising a temperature between least 4 degrees Celsius to at most 1400 degrees Celsius, via heat transfer, convert the incoherent radiation into at least one narrowband lobe of coherent electromagnetic waves, having the predetermined wavelength, and subsequently, emit the at least one narrowband lobe of coherent electromagnetic waves;
    determining a first distance between the radiator and the rectenna based on the predetermined wavelength;
    constructing a rectenna-radiator assembly comprising the radiator, a vacuum chamber, and the rectenna, arranged in sequence, wherein the vacuum chamber has a first surface that contacts the radiator and a second surface opposite the first surface that contacts the rectenna, and the rectenna and radiator are separated by the first distance and the radiator and rectenna are oriented such that the radiator emits the at least one narrowband lobe of coherent electromagnetic waves towards the rectenna;
    placing the rectenna-radiator assembly at a location, wherein the radiator is disposed between a heat source and the rectenna, such that heat is transferred to the radiator from the heat source;
    capturing, by the antenna of the rectenna, the at least one narrowband lobe of coherent electromagnetic waves emitted from the radiator;
    when a temperature of the rectenna-radiator assembly exceeds or diminishes below at least one predetermined physiologic parameter, converting, by the antenna of the rectenna, the narrowband lobes of coherent electromagnetic waves into alternating current; and
    converting, by the diode of the rectenna, the alternating current into direct current.

2. The method of claim 1, further including the step of supplying a device with the direct current produced by the diode of the rectenna.

3. The method of claim 1, wherein the predetermined temperature range comprises at least 65 degrees Celsius to at most 816 degrees Celsius.

4. The method of claim 1, wherein the first distance is greater than 0.25 to at most 2 times the predetermined wavelength of the emitted at least one narrowband lobe of coherent electromagnetic waves from the radiator.

5. A method of converting thermal energy into electrical energy, comprising:

identifying a predetermined wavelength for a narrowband-receiving rectenna, the predetermined wavelength selected from the infrared spectrum of wavelengths, wherein the predetermined wavelength has an associated narrowband frequency, the narrowband-receiving rectenna having at least one narrowband antenna and a DC-rectifying diode;

selecting a radiator configured to capture an incoherent radiation comprising a temperature between at least 4 degrees Celsius to at most 1400 degrees Celsius, via heat transfer, convert the incoherent radiation into at least one artificial narrowband lobe of coherent electromagnetic waves having the predetermined wavelength, and subsequently, emit the at least one artificial narrowband lobe of coherent electromagnetic waves;

determining a first distance between the radiator and the narrowband-receiving rectenna based on the predetermined wavelength, wherein the first distance is greater than 0.25 to at most 2 times the predetermined wavelength of the emitted at least one artificial narrowband lobe of coherent electromagnetic waves from the radiator;

constructing a rectenna-radiator assembly with the narrowband-receiving rectenna and radiator separated by a vacuum chamber having a first surface that contacts the radiator and a second surface opposite the first surface that contacts the rectenna, whereby the vacuum chamber is sealed, such that air and pressure are diminished to a predetermined amount from the vacuum chamber, and wherein the narrowband-receiving rectenna and radiator are separated by the first distance, whereby the radiator and narrowband- receiving rectenna are oriented such that the radiator emits the at least one artificial narrowband lobe of coherent electromagnetic waves towards the narrowband-receiving rectenna, thereby enabling the at least one artificial narrowband lobe of coherent electromagnetic waves to travel in a uniform manner;

placing the rectenna-radiator assembly at a location such that heat is transferred to the radiator from a heat source;

capturing, by the at least one narrowband antenna of the narrowband-receiving rectenna, the at least one artificial narrowband lobe of coherent electromagnetic waves emitted from the radiator;

when a temperature of the rectenna-radiator assembly exceeds or diminishes below at least one predetermined physiologic parameter, converting, by the at least one narrowband antenna of the narrowband-receiving rectenna, the at least one artificial narrowband lobe of coherent electromagnetic waves into alternating current; and converting, by passing the alternating current through the DC-rectifying diode of the narrowband-receiving rectenna, the alternating current into direct current.

6. The method of claim 5, further including the step of supplying a device with the direct current produced by the diode of the rectenna.

7. The method of claim 5, further including the step of disposing the at least one rectenna antenna about a surface of the rectenna.

8. The method of claim 7, further including the step of tuning the at least one rectenna antenna to capture the predetermined wavelength of the at least one artificial narrowband lobe of coherent electromagnetic waves by securing the at least one rectenna antenna at a corresponding angle at which the at least one artificial narrowband lobe of coherent electromagnetic radiation is emitted from the radiator.

9. The method of claim 5, further including the step of, while at least one rechargeable battery source is in use, supplying the at least one rechargeable battery source with the direct current, thereby storing the electrical energy produced by the DC-rectifying diode of the narrowband-receiving rectenna, increasing the length of utility of the at least one in-use rechargeable battery source, or both.

* * * * *